(12) United States Patent
Gouin et al.

(10) Patent No.: US 7,171,611 B2
(45) Date of Patent: Jan. 30, 2007

(54) APPARATUS FOR DETERMINING THE ACCESS TIME AND/OR THE MINIMALLY ALLOWABLE CYCLE TIME OF A MEMORY

(75) Inventors: Vincent Gouin, Mandelieu (FR); Simone Borr, Antibes (FR); Yann Tellier, Valbonne (FR)

(73) Assignee: Infineon Technologies AG, Munich (DE)

( * ) Notice: Subject to any disclaimer, the term of this patent is extended or adjusted under 35 U.S.C. 154(b) by 197 days.

(21) Appl. No.: 11/036,542

(22) Filed: Jan. 14, 2005

(65) Prior Publication Data

US 2005/0204211 A1 Sep. 15, 2005

(30) Foreign Application Priority Data

Jan. 15, 2004 (EP) .................................. 04290106

(51) Int. Cl.
*G06B 27/00* (2006.01)
*H03M 13/00* (2006.01)
*G06F 11/00* (2006.01)
*G06F 12/00* (2006.01)

(52) U.S. Cl. ...................... 714/814; 714/815; 711/167

(58) Field of Classification Search ..................... None
See application file for complete search history.

(56) References Cited

U.S. PATENT DOCUMENTS

| | | | |
|---|---|---|---|
| 4,430,735 A | 2/1984 | Catiller | |
| 4,875,201 A | 10/1989 | Dalzell | |
| 5,083,299 A | 1/1992 | Schwanke et al. | |
| 5,923,676 A | 7/1999 | Sunter et al. | |
| 5,995,424 A | 11/1999 | Lawrence et al. | |
| 6,266,749 B1 | 7/2001 | Hashimoto et al. | |
| 6,370,675 B1* | 4/2002 | Matsumura et al. | 716/6 |
| 6,424,583 B1 | 7/2002 | Sung et al. | |
| 6,567,941 B1* | 5/2003 | Turnquist et al. | 714/724 |
| 6,570,944 B2* | 5/2003 | Best et al. | 375/355 |

* cited by examiner

*Primary Examiner*—Christine T. Tu
(74) *Attorney, Agent, or Firm*—Patterson & Sheridan, L.L.P.

(57) ABSTRACT

An apparatus for determining the access time and the minimally allowable cycle time of a memory, comprising a clock for generating a signal which stimulates memory data output, programmable delay means for generating a delayed signal, sample-and-hold means for sampling the data output of the memory in response to the delayed signal, a comparator for comparing the sampled data to reference values, and a test status generator, wherein the test status depends on the results of more than one of the comparisons.

20 Claims, 2 Drawing Sheets

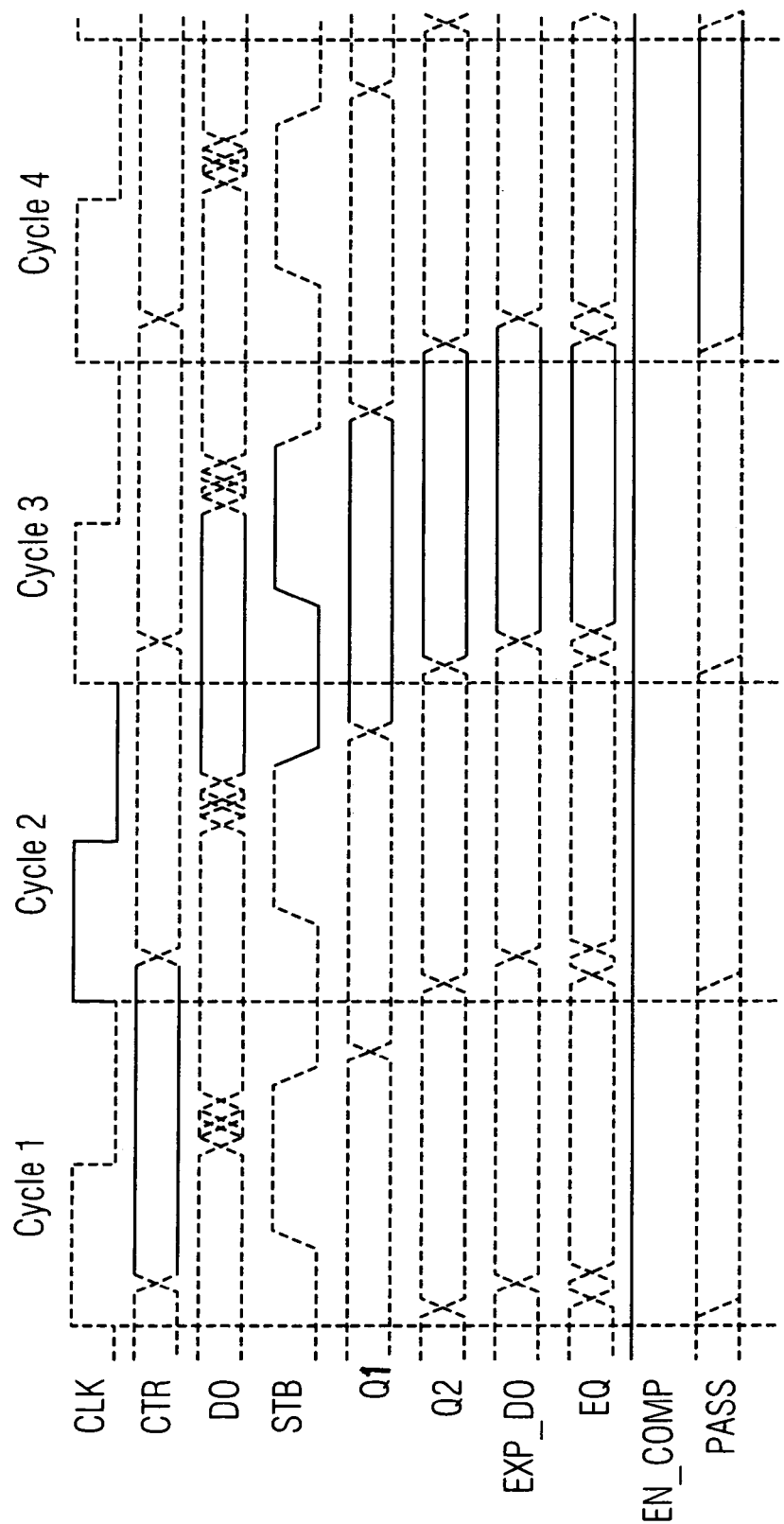

APPARATUS FOR DETERMINING THE ACCESS TIME AND/OR THE MINIMALLY ALLOWABLE CYCLE TIME OF A MEMORY

CROSS-REFERENCE TO RELATED APPLICATIONS

This application claims foreign priority benefits under 35 U.S.C. §119 to co-pending European patent application number EP 04 290 106.6, filed 15 Jan. 2004. This related patent application is herein incorporated by reference in its entirety.

BACKGROUND OF THE INVENTION

1. Field of the Invention

The invention broadly relates to built in test modules for integrated circuits and deals more particularly with an apparatus for determining the access time and/or the minimally allowable cycle time of a memory forming part of an integrated circuit chip. In particular the invention also relates to test chips and especially to library test chips.

2. Description of the Related Art

To confirm the functionality of chips before they are shipped, electronic testers are employed to test the functionality of each chip. One of the goals is to measure or to determine timings which characterize the performance of the device under test.

Two types of timings must be measured or determined: constraint type timings and delay type timings. Constraint type timings are related to a minimum delay which has to be respected on the input signals of the device under test. The cycle time measured as the period of time between two successive clock rising edges is an example of a constraint type timing. Other examples of a constraint type timing are setup and hold times. Delay type timings are related to a propagation delay from an input to an output of the device under test. The access time of a memory serves as an example of a delay type timing.

The characterization of timings of embedded memories, especially if they are part of library components, must achieve a high relative resolution in the range of 1 percent. In the case of access times or cycle times of 500 picoseconds, the stated requirement leads to an absolute accuracy of 5 picoseconds.

High resolution characterization of delay type timings requires high resolution delay measurement devices. Practically, the delay measurement devices must be able to measure the delay between two signals with a resolution of 5 picoseconds, for example.

These very demanding requirements are impossible to meet if the highly sensitive signals generated or to be measured have to cross the interface between the chip and the tester. This is the reason for the necessity for embedding all the sensitive devices and operations inside the chip. Special methods have to be used so that the remaining transfers with the tester do not involve sensitive signals.

The operations inside current integrated circuits occur at frequencies which have exceeded frequencies of testers or printed circuits in the past years. Tests of embedded memories must be undertaken at real frequencies, meaning at frequencies the application employing these memories will eventually run. Therefore, the access time of memories must be characterized at low and also at high frequencies. Furthermore, the minimally allowable cycle time characterization also requires high frequencies. The typical frequencies for such tests and characterizations are higher than 1 GHz.

Since common embedded memories have hundreds of input and output signals, such as addresses, data inputs and outputs, controlling them by an external tester at high frequencies is not feasible. Therefore, the devices which stimulate and test the memory need to be embedded.

For measuring the propagation delays, the tester initiates a measurement by supplying a stimulus signal to the delay path under test and then detects when the output of interest has responded. In U.S. Pat. No. 6,424,583, the principle of such a measurement circuit is described. According to another method exemplarily described in the U.S. Pat. No. 5,923,676, the device under test is inserted in a ring oscillator. A ring oscillator is a chain of inverters or other logic gates permanently connected in a ring or loop, in which the total number of inversions in the loop is odd thus ensuring oscillation. The loop oscillates at a frequency inversely proportional to the delay around the loop. The minimum delay enabling a correct operation of the device under test is determined by successively applying different setup and hold times. The setup and hold times are expressed in equivalent inverter delays.

The access time of a memory is defined as the worst access time over all bits of the memory. For a 1 Mbit memory, the access time of the memory is thus the worst access time over more than one million of access times. Since the measurements are undertaken employing an external tester, it is very time consuming to measure all access times and to maximize them afterwards. Therefore, there is a need to provide an apparatus capable of finding the maximum access time on the chip and capable of subsequently measuring this maximum access time. The above formulated aspect also correspondingly applies to the determination of the minimally allowable cycle time at which the memory can run.

There is a further need for an apparatus that is capable of particularly characterizing a timing on all possible conditions related to other timings. For instance, the specified access time must be valid from low to high memory operating frequencies.

In the case of a RAM (Random Access Memory), the timings depend on the memory content and on the sequences of operations. Thus, the apparatus must particularly be capable of putting the most critical content in the locations neighboring the location under test. The apparatus must particularly also be able to stimulate the RAM with the most critical sequence of operations.

The timings which shall be measured are likely to be lower than 1 nanosecond. It has to be stated that in this case a direct timing measurement is not feasible employing standard testers, standard pads or standard chip routings. Practically, the data output waveforms detected at the needles of the tester suffer from several severe attacks, such as crosstalks between data outputs, reflections, voltage drops and/or inductive glitches on the supply of the pads. These problems can be overcome by converting the timings to low frequencies. Circuits used for time to frequency conversions are described in U.S. Pat. Nos. 5,083,299, 5,923,676 and 4,875,201, for instance.

SUMMARY OF THE INVENTION

In accordance with one embodiment of the present invention, an apparatus for determining the access time and/or the minimally allowable cycle time of an embedded memory comprises programmable delay means, sample-and-holdmeans, a comparator and a test status generator. The apparatus also forms part of the integrated circuit the memory is embedded in.

For the purpose of data output, a control terminal of the memory is fed by a timing signal. In response to the timing signal, data is outputted from the memory in case of a read operation.

The programmable delay means comprise an input terminal for receiving the timing signal and an output terminal on which a delayed timing signal is generated. The delayed timing signal is generated by delaying the timing signal for a programmed delay.

The sample-and-hold means comprise a control terminal connected to the output terminal of the programmable delay means, at least one input terminal for sampling output data of the memory in response to the delayed timing signal and at least one output terminal on which the sampled data are outputted.

The programmable delay means coupled to the sample-and-hold means enable sampling of the output of the memory at a programmable delay with regard to the timing signal. If the programmed delay is greater than the access time of the memory, the value outputted by the sample-and-hold means will be equal to the result of the read operation. Hence, the output value of the sample-and-hold means indicates whether the access time is greater or smaller than the programmed delay.

An advantage provided by embodiments of the invention is that the signals exchanged between the memory, the sample-and-hold means and the programmable delay means are not degraded by any interface crossing because said devices are all embedded in the same chip.

The comparator is coupled to the sample-and-hold means. Its function is to compare the output data previously sampled by the sample-and-hold means to predetermined reference values.

The test status generator is coupled to the comparator. The test status generator generates a test status that depends on the results of more than one of the comparisons undertaken by the comparator. The test status indicates whether all comparisons previously performed have produced a positive result, meaning that both input operands had the same value, or whether at least one comparison produced a negative result. Consequently, if all comparisons contributing to the test status produced a positive result, all timings were larger than the minimally allowable timings.

For the determination of the access time, this means that the test status indicates whether the currently programmed delay is greater or smaller than the access time. This determination requires as a prerequisite that the frequency of the timing signal is lower than the maximum operating frequency of the memory.

In the case of the minimally allowable cycle time being examined, the test status indicates whether the frequency with which the timing signal is repeated is greater or smaller than the maximum operating frequency, which corresponds to the minimally allowable cycle time. To be able to determine the minimally allowable cycle time, the programmed delay has to be at least of the same length as the access time.

Embedding the comparator and the test status generator in the same chip is necessary because of the high frequencies at which the test is run. Since common embedded memories comprise hundreds of input and output signals, such as addresses, data inputs and data outputs, controlling them by an external apparatus at high frequencies is not feasible. Therefore, embedding all devices needed for testing the memory in one chip allows the use of high frequencies during the determination of the access time and further allows stimulating the memory at its maximum operating frequency to determine this maximum operating frequency.

Advantageously, the number of comparisons, which are undertaken before a test status is produced, can be programmed. For example, all data of the memory may be outputted, sampled once, and compared to their reference values, before a test status is produced. Thus, a test status may be produced after the full test algorithm activating all memory locations has finished.

In the case of the determination of the access time, the maximum access time is found to be lower than the programmed delay if all outputs were correctly sampled during the test algorithm. On the contrary, if at least one output was not correctly sampled during the test algorithm, the maximum access time is found to be higher than the programmed delay. The delayed timing signal is then accordingly adjusted depending on the test status and the described procedure is repeated. A change of the logic state of the test status indicates the maximum access time. Once the maximum access time is determined, it can be measured. Consequently, the maximum access time is determined on the chip prior to any measurement, and the only measurement which has to be undertaken is the measurement of the programmed delay corresponding to the limit value. This is an advantage provided by embodiments of the invention in shortening the measurement, because only one time measurement has to be performed to obtain the access time of the memory.

For the determination of the minimally allowable cycle time, almost the same test algorithm as stated above has to be applied. Only the frequency of the timing signal has to be varied instead of the programmed delay. Then, a change of the logic state of the test status indicates the minimally allowable cycle time. Thus, the apparatus also enables determining the minimally allowable cycle time prior to any measurement.

The apparatus according to one embodiment of the invention may advantageously comprise a vector generator with at least one first output terminal on which a data pattern is generated and/or on which addresses are generated and/or on which control signals concerning chip select and/or read/write are generated. The data pattern and/or the addresses feed an input terminal of the memory. The data pattern may represent the worst case patterns for the memory content. The addresses generated by the vector generator select the data which shall be outputted from the memory. This enables stimulating the memory with the most critical sequence of operations.

Furthermore, the vector generator may also comprise a second output terminal which is connected to an input terminal of the comparator. This allows the vector generator to provide the comparator with the reference values which correspond to the data pattern written into the memory.

The comparator is advantageously designed as a multi-bit comparator.

Although the timing signal can be provided by an external clock, it is advantageous to embed the clock that generates the timing signal at its output terminal in the chip. The advantage is that the timing signals do not cross an interface between the chip and the apparatus. This prevents any signal degradation due to an interface crossing.

The clock is advantageously a programmable clock. In particular, it may comprise a programmable ring oscillator. The programmable ring oscillator facilitates the measurement of the minimally allowable cycle time. For determining the minimally allowable cycle time, a full test cycle is run by activating all memory locations. Then a status is produced showing whether the minimally allowable cycle time is greater or lower than the programmed period.

The sample-and-hold means advantageously comprise a first set of flip-flops.

In accordance with one advantageous configuration of the apparatus according to one embodiment of the invention, said first set of flip-flops may be operated in a transparent mode. This advantageous configuration of the apparatus allows measuring the minimally allowable cycle time without a constraint caused by the access time.

To relax the constraint on the comparator speed, it is advantageous that the apparatus according to one embodiment of the invention comprises a second set of flip-flops which is arranged between the first set of flip-flops and the comparator. The second set of flip-flops is controlled by the timing signal.

In accordance with another advantageous configuration of the apparatus, the apparatus comprises a feedback circuit which couples the output terminal of the programmable delay means back to their input terminal. In this case, the connection between the clock and the programmable delay means is disconnected. This advantageous configuration leads to a time to frequency conversion of the programmable delay.

Advantageously, the apparatus according to one embodiment of the invention comprises a frequency divider having an input which can be connected to the output terminal of the clock or to the output terminal of the programmable delay means. Alternatively, the apparatus may comprise a first frequency divider connected to the output terminal of the clock and a second frequency divider connected to the output terminal of the programmable delay means.

The programmable delay means with their feedback path and the frequency divider enable converting the programmed delay to a low frequency. This conversion is another advantage of the invention. Practically, it enables the value of the programmed delay to be obtained by measuring the equivalent lower frequency. This allows an accurate measurement of the programmed delay with low cost standard pads and testers having moderate capabilities regarding the transfer of signals with high frequency components. This advantage of the invention is complementary to the above mentioned advantage of the invention of embedding the programmable delay means. Both features lead to a global advantage of the invention of enabling the use of high resolution programmable delay means within the chip and of enabling the accurate measurement of the programmed delay with low cost standard pads and testers. Moreover, embedding the programmable ring oscillator and dividing its frequency enables the use of a high resolution programmable oscillator within the chip and further enables the accurate measurement of the frequency of the oscillator with low cost standard pads and testers.

In accordance with one embodiment of the present invention, an apparatus, which facilitates the measurement of the maximum time with which signals propagate through a block embedded in an integrated circuit chip and/or of the maximum operating frequency of this block, comprises a clock, a signal generator, programmable delay means, sample-and-hold-means, a comparator and a test status generator.

The clock produces a timing signal. The signal generator generates signals in response to the timing signal. The signals generated by the signal generator feed input terminals of the block. The programmable delay means generate a delayed timing signal by delaying the timing signal for a programmed delay. The sample-and-hold means sample the output signals of the block in response to the delayed timing signal. The comparator compares the sampled output signals to reference values. The test status generator generates a test status, wherein the test status depends on the results of more than one of the comparisons undertaken by the comparator. As explained above, the test status on the one hand can indicate whether the programmed delay is greater or smaller than the maximum access time, and/or on the other hand, the test status can indicate whether the frequency with which the timing signal is repeated is greater or smaller than the maximum operating frequency.

The advantage of the apparatus according to one embodiment of the invention is that the maximum time with which signals propagate through the block and the maximum operating frequency can be determined on the chip prior to any measurement. The only measurements which have to be undertaken are the measurements of the programmed delay and of the frequency of the timing signal corresponding to the limit values.

In accordance with one embodiment of the present invention, a method for determining the access time of a memory forming part of an integrated circuit chip comprises the following steps:

(1) stimulating data output stored at predetermined addresses in said memory at a given time;

(2) sampling the data output terminal of said memory at a time delayed with regard to said given time;

(3) comparing sampled output data to expected values;

(4) repeating steps (1) through (3) with data output from other addresses;

(5) if at least one sampled output data and its expected value do not agree, repeating steps (1) through (4) with prolonged delay times until all sampled output data and their expected values agree;

(6) repeating steps (1) through (4) with successively shortened delay times until at least one sampled output data and its expected value do not agree; and (7) determining said access time by measuring the delay time at which all sampled output data and their expected values agreed last.

The method according to one embodiment of the invention has the same advantages over conventional methods of determining the access time as those provided by the apparatus described above.

Advantageously, before step (1) is performed, predetermined data patterns are written into said memory. This allows the worst case data patterns to be written into the memory prior to the determination of the access time.

In accordance with the present invention, a method for determining the minimally allowable cycle time of a memory forming part of an integrated circuit chip comprises the following steps:

(1) stimulating said memory in read and write mode at predetermined addresses and at a given cycle time;

(2) sampling the data output terminal of said memory;

(3) comparing sampled output data to expected values;

(4) repeating steps (1) through (3) for other addresses;

(5) if at least one sampled output data and its expected value do not agree, repeating steps (1) through (4) with prolonged cycle times until all sampled output data and their expected values agree;

(6) repeating steps (1) through (4) with successively shortened cycle times until at least one sampled output data and its expected value do not agree; and (7) determining said minimally allowable cycle time by measuring the cycle time at which all sampled output data and their expected values agreed last.

The method described above shows the same advantages over conventional methods of determining the minimally allowable cycle time as those provide by the apparatus described above.

BRIEF DESCRIPTION OF THE DRAWINGS

The invention is explained below in an exemplary manner with reference to the drawings, in which:

FIG. 2 shows signal waveforms for illustrating the method of operation of the exemplary embodiment of the apparatus.

DETAILED DESCRIPTION OF THE PREFERRED EMBODIMENT

Figure 1:
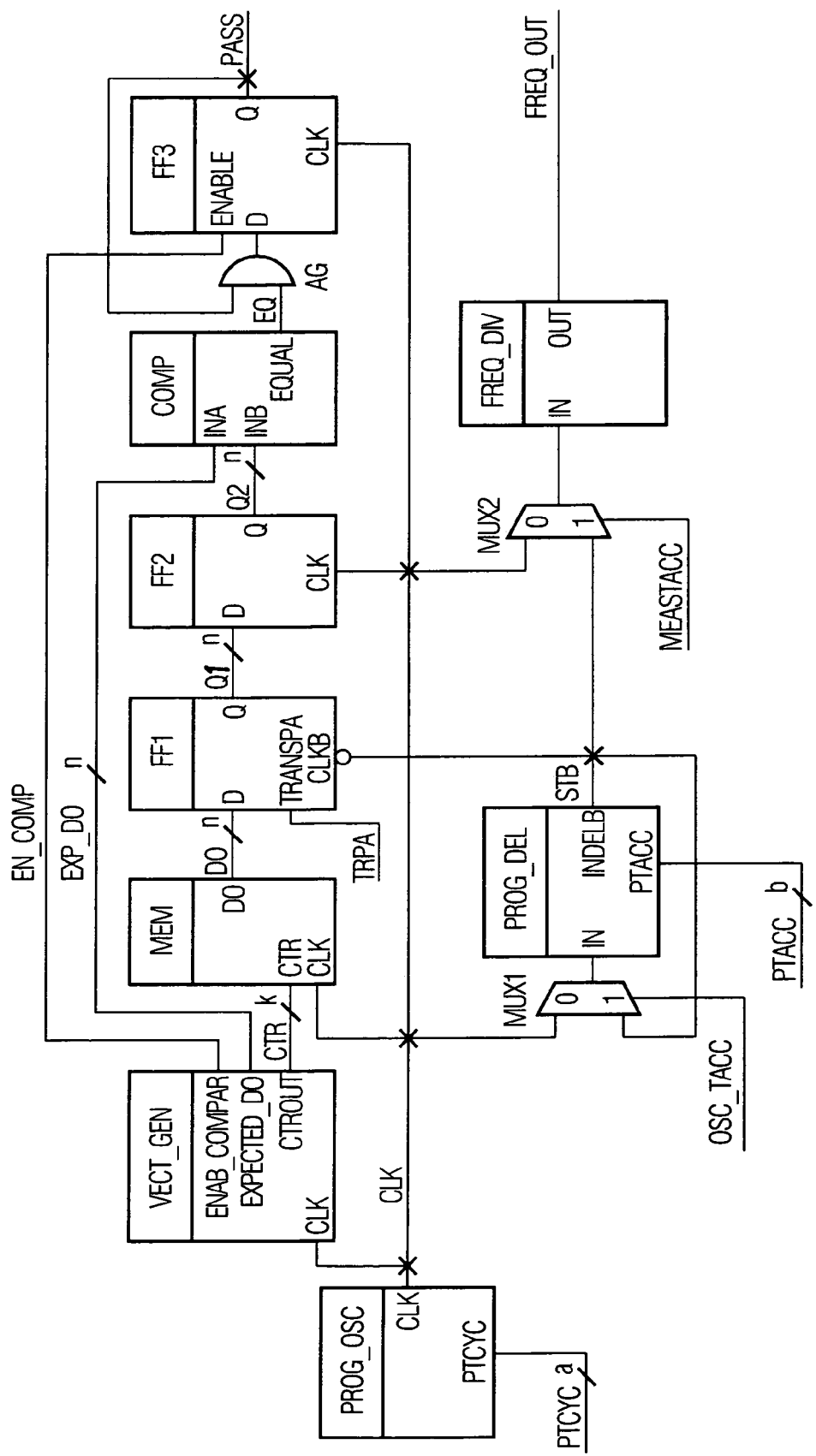
FIG. 1 shows an exemplary embodiment of the apparatus.

FIG. 1 shows the circuit diagram of an apparatus which is employed for determining the access time and/or the minimally allowable cycle time of a memory MEM. The memory MEM is an SRAM (Static Random Access Memory). The data outputs DO of the memory MEM are connected to the inputs D of a set of flip-flops FF1. The flip-flops FF1 and another set of flip-flops FF2 are connected in series.

The outputs Q of the flip-flops FF2 feed an input INB of a multi-bit comparator COMP. An input INA of the multi-bit comparator COMP is fed by a vector generator VECT_GEN. The vector generator VECT_GEN also feeds the control inputs CTR of the memory MEM.

The multi-bit comparator COMP performs the comparison of two words each composed of one or more bits. One of these words feeds the input INA and the other word feeds the input INB of the multi-bit comparator COMP. The multi-bit comparator COMP outputs at its output EQUAL a single bit which shows a high logical level if the two words are equal and a low logical level if the two words differ in at least one bit.

The output EQUAL of the multi-bit comparator COMP feeds a first input of an AND gate AG. The output of the AND gate AG feeds the input D of a flip-flop FF3. The output Q of the flip-flop FF3 feeds back into a second input of the AND gate AG.

A programmable oscillator PROG_OSC generates a timing signal CLK on its output CLK which feeds the clock inputs of the vector generator VECT_GEN, the memory MEM and the flip-flops FF2 and FF3. The programmable oscillator PROG_OSC is programmable via its control input PTCYC.

An input IN of a programmable delay cell PROG_DEL may be connected to the output CLK of the programmable oscillator PROG_OSC or to its output INDELB via a multiplexer MUX1. The programmable delay cell PROG_DEL is programmable via its control input PTACC. The programmable delay cell PROG_DEL is an inverting path meaning that its output INDELB displays the opposite value of its input IN after the programmed delay. The output INDELB of the programmable delay cell PROG_DEL is connected to the clock inputs of the flip-flops FF1. The flip-flops FF1 are sensitive to falling commutations of their clock inputs, meaning that they sample the data at their inputs D when a falling commutation at their clock inputs occurs.

An input IN of a frequency divider FREQ_DIV can be connected to the output CLK of the programmable oscillator PROG_OSC or to the output INDELB of the programmable delay cell PROG_DEL via a multiplexer MUX2. The multiplexer MUX2 may be controlled by the control signal MEASTACC to select among its inputs to be output to the frequency divider FREQ_DIV. The output signal FREQ_OUT of the frequency divider FREQ_DIV may be utilized to determine the access time and the cycle time. In another embodiment, without the multiplexer MUX2, the frequency divider FREQ_DIV may comprise a first frequency divider having an input for receiving the timing signal (CLK) and a second frequency divider having an input for receiving the delayed timing signal (STB).

The method of operation of the apparatus shown in FIG. 1 is described below.

A rising edge of the timing signal CLK stimulates data output DO from the memory MEM. The addresses of the data DO which are subject of the data output are determined by the control signals CTR which are generated by the vector generator VECT_GEN. For an SRAM, the control signals CTR typically contain information concerning chip select, read/write, data inputs and addresses. The flip-flops FF1 sample the data outputs DO of the memory MEM in response to a delayed timing signal STB. The delayed timing signal STB is generated by the programmable delay cell PROG_DEL. The multi-bit comparator COMP compares the sampled data Q2 to reference values EXP_DO (or EXPECTED_DO), which are provided by the vector generator VECT_GEN. The reference values EXP_DO are the correct values of the outputted data. The results of these comparisons are evaluated by the AND gate AG and the flip-flop FF3. As depicted in FIG. 1, the AND gate AG and the flip-flop FF3 are connected in such a manner that they compose a test status generator which produces the signal PASS at the output Q of the flip-flop FF3. If all comparisons of the test sequence were passing, the signal PASS has a high logical level at the end of the test sequence. On the contrary, if one or more comparisons failed, the signal PASS has a low logical level.

After all memory locations of the memory MEM were activated once or several times, the status of the test provided by the signal PASS is valid. If all output data DO were correctly sampled during the test algorithm, the maximum access time is found to be lower than the programmed delay. On the contrary, if at least one output data DO was not correctly sampled during the test algorithm, the maximum access time is found to be higher than the programmed delay. The delay is then accordingly adjusted by changing the values of the control signal PTACC. The described procedure must be repeated over a trial and error type technique until the maximum access time is found. The maximum access time is determined to be the lowest value of the programmable delay allowing a successful complete test run that activates all memory locations at least once. Consequently, the maximum access time is determined on the chip prior to any measurement. The only measurement which has to be undertaken is the measurement of the programmed delay.

To determine the minimally allowable cycle time, almost the same method is carried out as for the determination of the access time. For this, two options are possible regarding the constraints on the access time. Firstly, the transparent mode of the flip-flops FF1 may be activated by applying a control signal TRPA to a control input TRANSPA of the flip-flops FF1. This enables the minimally allowable cycle time to be determined without a constraint on the access time. Secondly, provided the access time has already been determined, the programmable delay may be set to a value higher than the access time of the memory MEM so that successful sampling of the output data DO of the memory MEM is possible.

In FIG. 2, signal waveforms are shown illustrating the method of operation of the apparatus shown in FIG. 1.

The following description is valid for enabled flip-flops FF1, meaning the flip-flops FF1 do not operate in the transparent mode.

Cycle 1 starts with the first rising edge of the timing signal CLK. The vector generator VECT_GEN is triggered by the rising edge of the timing signal CLK and produces the control signals CTR after a delay. The control signals CTR will be used by the memory MEM during cycle 2.

Cycle 2 starts with the second rising edge of the timing signal CLK. The memory MEM is triggered in access mode by the rising edge of the timing signal CLK. The output data DO are produced by the memory MEM. The output data DO are sampled employing the flip-flops FF1 which are strobed by the falling edge of the delayed timing signal STB. The flip-flops FF1 consequently produce at their outputs Q the signal bus Q1 which is updated by the value of the data DO at the time when the falling edge of the delayed timing signal STB occurs.

Cycle 3 starts with the third rising edge of the timing signal CLK. The flip-flops FF2 are strobed by the rising edge of the timing signal CLK and they produce data Q2 at their outputs Q. The vector generator VECT_GEN generates the reference values EXP_DO that are reference operands for the multi-bit comparator COMP. Afterwards, the multi-bit comparator COMP generates its output signal EQ.

Cycle 4 starts with the fourth rising edge of the timing signal CLK. The flip-flop FF3 functioning together with the AND gate AG as a test status generator is strobed by the rising edge of the timing signal CLK. Depending on the values of signals PASS and EQ, the test status signal PASS is updated. Here the assumption is made that the signal PASS and the flip-flop FF3 were initialized to a high logical level prior to the cycles depicted in FIG. 2. Therefore the signal PASS can only perform a falling commutation because its function is to memorize whether at least one comparison failed.

The signal EN_COMP (or ENAB_COMPAR) is produced by the vector generator VECT_GEN and is used to enable the sampling of the results of the comparisons only at given cycles. In the example described here, the signal EN_COMP is always active. The signal EN_COMP would typically be activated when the memory MEM is accessed in the write mode.

While the foregoing is directed to embodiments of the present invention, other and further embodiments of the invention may be devised without departing from the basic scope thereof, and the scope thereof is determined by the claims that follow.

What is claimed is:

1. An apparatus for determining at least one of an access time and a minimally allowable cycle time of a memory, the apparatus comprising:
    programmable delay means having an input terminal for receiving a timing signal and having an output terminal providing a delayed timing signal generated by delaying the timing signal for a programmed delay;
    sample-and-hold means having a control terminal for receiving the delayed timing signal, at least one input terminal for sampling data output from the memory in response to the delayed timing signal and at least one output terminal for providing sampled output data;
    a comparator, coupled to the sample-and-hold means, for comparing the sampled output data to reference values; and
    a test status generator coupled to the comparator, the test status generator providing a test status depending on results of a plurality of comparisons between the sampled output data and reference values,
    wherein the apparatus and the memory are embedded in an integrated circuit chip and wherein data output from memory is stimulated by the timing signal supplied to a control terminal of the memory.

2. The apparatus of claim 1, further comprising:
    a vector generator having a first output terminal providing addresses and a second output terminal providing the reference values, wherein the addresses determine the data output from the memory and the reference values are supplied to an input terminal of the comparator.

3. The apparatus of claim 2, wherein the first output terminal of the vector generator further provides a data pattern which is written into memory and the second output terminal further provides at least one of chip select control signals and read/write control signals.

4. The apparatus of claim 1, wherein the comparator comprises a multi-bit comparator.

5. The apparatus of claim 1, further comprising:
    a programmable clock having an output terminal providing the timing signal.

6. The apparatus of claim 5, wherein the clock comprises a programmable ring oscillator.

7. The apparatus of claim 1, wherein the sample-and-hold means comprise a first set of flip-flops which are operable in a transparent mode.

8. The apparatus of claim 7, wherein the sample-and-hold means further comprises a second set of flip-flops arranged between the first set of flip-flops and the comparator, the second set of flip-flops having a control terminal for receiving the timing signal.

9. The apparatus of claim 1, further comprising:
    a feedback circuit which couples the output terminal of the programmable delay means back to the input terminal of the programmable delay means such that the programmable delay means selectably receives the delayed timing signal instead of the timing signal.

10. The apparatus of claim 9, further comprising:
    a frequency divider having an input for selectively receiving the timing signal and the delayed timing signal.

11. The apparatus of claim 9, further comprising:
    a first frequency divider having an input for receiving the timing signal; and
    a second frequency divider having an input for receiving the delayed timing signal.

12. The apparatus of claim 1, wherein the apparatus is configured to determine at least one of a maximum time for which signals propagate through a block embedded in an integrated circuit chip and a maximum operating frequency of the block.

13. The apparatus of claim 12, further comprising:
    a clock having an output terminal providing the timing signal; and
    a signal generator having a control terminal for receiving the timing signal and having output terminals providing one or more signals generated in response to the timing signal, wherein the one or more signals are supplied to the input terminals of the block.

14. The apparatus of claim 13, further comprising:

a vector generator having a first output terminal providing a data pattern and addresses and a second output terminal providing the reference values, chip select control signals and read/write control signals, wherein the data pattern is written into the memory, the addresses determine the data outputted from the memory and the reference values are supplied to an input terminal of the comparator.

15. The apparatus of claim 14, wherein the sample-and-hold means comprise a first set of flip-flops and a second set of flip-flops arranged between the first set of flip-flops and the comparator, the second set of flip-flops having a control terminal for receiving the timing signal.

16. The apparatus of claim 15, further comprising:

a feedback circuit which couples the output terminal of the programmable delay means back to the input terminal of the programmable delay means such that the programmable delay means receives the delayed timing signal instead of the timing signal.

17. The apparatus of claim 16, further comprising:

a frequency divider having an input for selectively receiving the timing signal and the delayed timing signal.

18. A method for determining an access time of a memory forming part of an integrated circuit chip, the method comprising:

(1) stimulating data output stored at predetermined addresses in the memory at a given time;

(2) sampling data output from the memory at a time delayed with regard to the given time;

(3) comparing sampled output data to expected values;

(4) repeating steps (1) through (3) with data output from other addresses;

(5) determining whether at least one sampled output data and its respective expected value do not agree, and if so, repeating steps (1) through (4) with prolonged delay times until all sampled output data and their respective expected values agree;

(6) repeating steps (1) through (4) with successively shortened delay times until at least one sampled output data and its respective expected value do not agree; and (7) determining the access time by measuring the delay time at which all sampled output data and their respective expected values agreed last.

19. The method of claim 18, further comprising:

before step (1) is performed, writing predetermined data patterns into the memory.

20. A method for determining a minimally allowable cycle time of a memory forming part of an integrated circuit chip, the method comprising:

(1) stimulating, at a given cycle time, the memory in respective read and write modes at predetermined addresses in the memory;

(2) sampling data output from the memory;

(3) comparing sampled output data to expected values;

(4) repeating steps (1) through (3) with data output for other addresses;

(5) determining whether at least one sampled output data and its respective expected value do not agree, and if so, repeating steps (1) through (4) with prolonged cycle times until all sampled output data and their respective expected values agree;

(6) repeating steps (1) through (4) with successively shortened cycle times until at least one sampled output data and its respective expected value do not agree; and (7) determining the minimally allowable cycle time by measuring the cycle time at which all sampled output data and their respective expected values agreed last.

* * * * *